(12) United States Patent
Choi et al.

(10) Patent No.: US 8,871,651 B1
(45) Date of Patent: Oct. 28, 2014

(54) MASK FORMATION PROCESSING

(71) Applicant: GLOBALFOUNDRIES Inc., Grand Cayman (KY)

(72) Inventors: Dae Han Choi, Loudonville, NY (US); Zhuangfei Chen, Clifton Park, NY (US); Fangyu Wu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/940,535

(22) Filed: Jul. 12, 2013

(51) Int. Cl.
*H01L 21/302* (2006.01)

(52) U.S. Cl.
USPC ............ 438/717; 438/724; 438/736; 216/312

(58) Field of Classification Search
USPC ......... 438/445, 639, 643, 714, 725, 736, 737, 438/740, 744, 743, 717; 430/312, 313, 314; 216/41, 47
See application file for complete search history.

(56) References Cited

U.S. PATENT DOCUMENTS

| | | | |
|---|---|---|---|
| 6,177,699 B1 * | 1/2001 | Perng et al. .................... | 257/303 |
| 6,596,599 B1 * | 7/2003 | Guo ............................... | 438/305 |
| 8,148,269 B2 * | 4/2012 | Balseanu et al. .............. | 438/706 |
| 8,586,482 B2 * | 11/2013 | Arnold et al. ................. | 438/706 |

* cited by examiner

*Primary Examiner* — Lan Vinh

(74) *Attorney, Agent, or Firm* — Kevin P. Radigan, Esq.; Heslin Rothenberg Farley & Mesiti P.C.

(57) ABSTRACT

A mask for use in fabricating one or more semiconductor devices is fabricated by: providing sacrificial spacing structures disposed over a substrate structure, and including protective hard masks at upper surfaces of the spacing structures; disposing a sidewall spacer layer conformally over the sacrificial spacing structures; selectively removing the sidewall spacer layer from above the sacrificial spacing structures to expose the protective hard masks of the spacing structures, the selectively removing including leaving sidewall spacers along sidewalls of the sacrificial spacing structures; providing a protective material over the substrate structure; and removing the exposed protective hard masks from the sacrificial spacing structures, and thereafter, removing remaining sacrificial spacing structures and the protective material, leaving the sidewall spacers over the substrate structure as a mask.

20 Claims, 4 Drawing Sheets

MASK FORMATION PROCESSING

FIELD OF THE INVENTION

The present invention relates in general to semiconductor devices and to methods of fabricating semiconductor devices, and more particularly, to methods of fabricating masks for use, for instance, in fabricating of one or more semiconductor devices.

BACKGROUND

As is known, semiconductor device fabrication typically involves the process of transferring a mask pattern to a wafer with subsequent etching to remove unwanted material, for instance, to facilitate forming fin structures and/or gate structures of fin-type field-effect transistors (FINFETs) or to facilitate forming field-effect transistors (FETs) in general. This process is generally referred to as lithographic processing. As the size of technology nodes continues to decrease, significant challenges continue to arise due (in part) to issues related to traditional lithographic processing techniques, including issues related to mask formation.

BRIEF SUMMARY

The shortcomings of the prior art are overcome, and additional advantages are provided through the provision, in one aspect, of a method which includes, for instance: providing sacrificial spacing structures disposed over a substrate structure, and including protective hard masks at upper surfaces thereof; disposing a sidewall spacer layer conformally over the sacrificial spacing structures; selectively removing the sidewall spacer layer from the sacrificial spacing structures to expose the protective hard masks thereof, the selectively removing including leaving, at least in part, sidewall spacers along sidewalls of the sacrificial spacing structures; providing a protective material over the substrate structure; and removing the exposed protective hard masks from the sacrificial spacing structures, and thereafter, removing remaining sacrificial spacing structures and the protective material, leaving the sidewall spacers over the substrate structure as a mask.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Further, note that in making reference below to the drawings (which are not drawn to scale for ease of understanding) the same reference numbers used throughout different figures designate the same or similar components.

In one aspect, semiconductor device fabrication typically involves using, for instance, lithography processing to facilitate transferring a mask pattern onto semiconductor wafer, and thus etching the wafer using the transferred pattern to remove unwanted material. Lithography and etch processes may be used, for instance, to facilitate forming circuit features such as fin structures, which, in one example, may be fabricated using a self-aligned double patterning process (also referred to as sidewall image transfer processing). As integration density of semiconductor devices continues to increase, significant challenges continue to arise with use of traditional lithographic techniques to pattern lined structures. For instance, a lack of planarity or uniformity of the mask pattern created using traditional mask fabrication processes may be an issue in subsequent processing.

By way of example, FIGS. 1A-1E depict one embodiment of a process for fabricating a double patterned lithography mask for use, for instance, in fabricating one or more semiconductor devices.

Figure 1A:
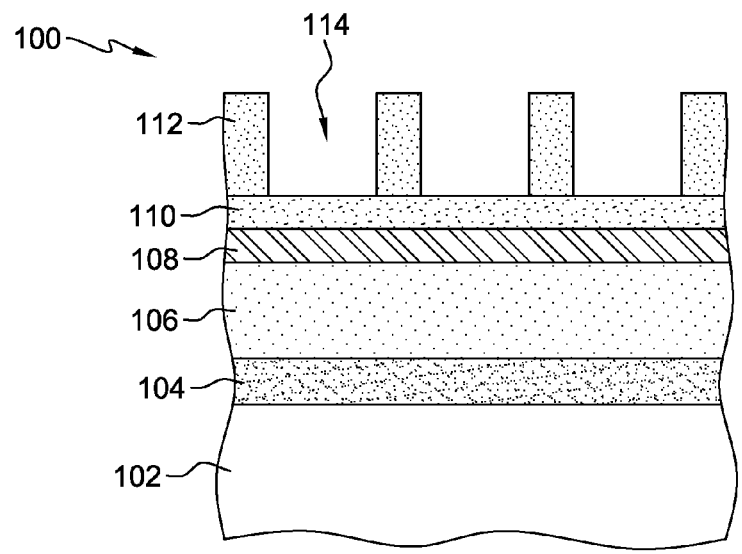
FIGS. 1A-1E depict one example of a process for fabricating a mask for use, for instance, in fabricating one or more semiconductor devices.
Figure 1B:
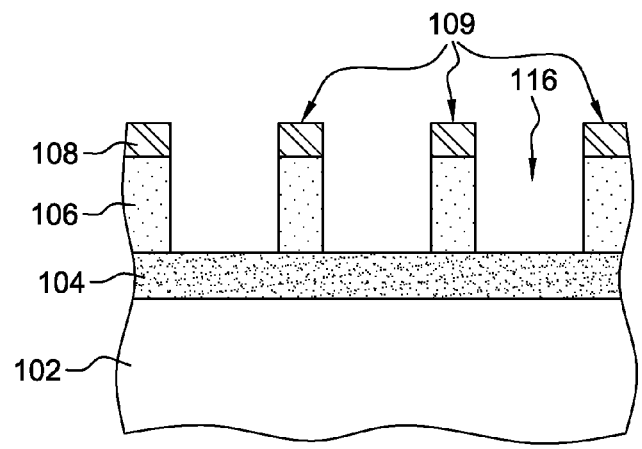

One embodiment of an intermediate process structure 100 is depicted in FIG. 1A. This structure 100 includes a substrate 102, such as a semiconductor substrate (for instance, a silicon substrate), and multiple layers disposed over substrate 102. The multiple layers may include, for instance, a protective substrate mask layer 104, a sacrificial spacing layer 106 disposed over protective substrate mask layer 104 and a protective hard mask layer 108 disposed over sacrificial spacing layer 106. In one embodiment, sacrificial spacing layer 106 is a sacrificial spacing material such as, amorphous-carbon or any conventional organic material, which as understood in the art, may be employed to hold positions or form spacing for the mask being formed. The noted layers of structure 100 of FIG. 1A may be formed using a variety of different materials and fabrication techniques, such as chemical vapor deposition (CVD), atomic layer deposition (ALD), physical vapor deposition (PVD) or plasma-enhanced versions of such processes. The thickness of the depicted layers may also vary, depending on the particular application.

By way of an example, protective substrate mask layer 104 may be a layer of silicon nitride, formed over a silicon substrate 102. Together these layers define one example of a substrate structure. Protective hard mask layer 108 is formed over sacrificial spacing layer 106. By way of further example, protective hard mask layer 108 may be formed of the same material as protective substrate mask layer 104, with this same material being, in one example, silicon nitride (SiN) or silicon-oxynitride (SiON) formed by CVD processing. One or more lithographic processing steps may be performed to create sacrificial spacing structures from the multi-layer structure of FIG. 1A. These lithographic processing steps may include (for instance) providing an anti-reflective coating layer 110 over protective hard mask layer 108, and providing a patterned photoresist 112 over anti-reflective coating layer 110. In one example, anti-reflective coating layer 110 may be a bottom anti-reflective coating (BARC) layer used to minimize pattern distortions due to reflections from the subsequent etching process. Patterned photoresist 112 includes openings 114, which facilitate the subsequent patterning of protective hard mask layer 108.

One or more lithographic etching processes are performed to transfer the pattern from patterned photoresist 112 of FIG. 1A to the protective hard mask layer 108. These process operations may include, for example, an anti-reflective-coating open step and a hard-mask open step. A final etch step is performed to obtain the structure depicted in FIG. 1B, in which the patterned photoresist layer and anti-reflective coating layer of the structure of FIG. 1A have been removed and the sacrificial spacing layer 106 (e.g., amorphous-carbon) has been etched to define a pattern of sacrificial spacing structures 109. As shown, sacrificial spacing structures 109 include protective hard masks 108 (disposed at the upper surfaces thereof) over sacrificial spacing layer or material 106, and are disposed over protective substrate mask 104, and separated by spaces 116.

Figure 1C:
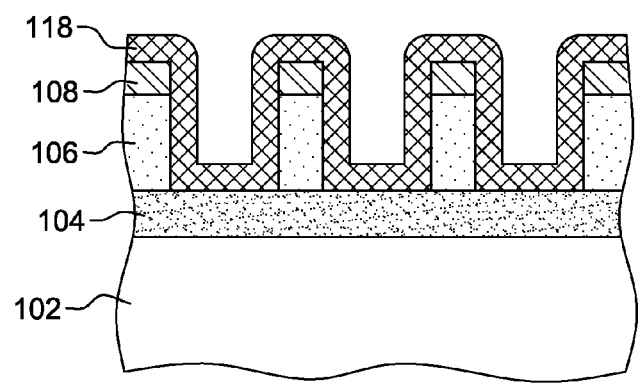

As depicted in FIG. 1C, a sidewall spacer layer 118 is conformally provided over sacrificial spacing structures 109 and the substrate structure. Note that sidewall spacer layer 118 may be fabricated of a material that is substantially similar to the material defining protective hard masks 108 and/or protective substrate mask 104. In one example, sidewall spacer layer 116 may include, for instance, a nitride (such as, for example, $Si_3N_4$ or SiN), conformally deposited using a variety of techniques, such as, for example, chemical vapor deposition (CVD) or atomic layer deposition (ALD).

Figure 1D:
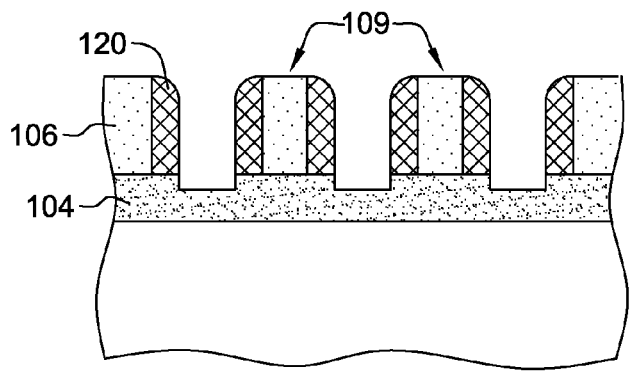

As illustrated in FIG. 1D, the sidewall spacer layer is etched, for instance, by any appropriate non-selective etching process, to form sidewall spacers 120, along the sidewalls of sacrificial spacing structures 109. As a part of this one-step etch process, the sidewall spacer layer is also etched from above protective substrate mask 104, between sacrificial spacing structures 109, resulting in exposing underlying protective substrate mask 104. Note that this etching process is typically prolonged to also etch protective hard masks 108 (see FIG. 1C) from the sacrificial spacing structures 109, and to facilitate exposing the remaining sacrificial spacing material 106 for subsequent removal. This non-selective over-etching process performed (in part) to etch away the protective hard masks 108 (see FIG. 1C) disadvantageously can result in etching of the exposed protective substrate mask 104, and thereby result in protective substrate mask thickness variations.

Alternately, protective substrate mask variations may also result from a two-step etch process, which results in breakthrough etching the protective hard masks from above the sacrificial spacing structures to expose the sacrificial spacing structures for subsequent removal processes. This breakthrough processing may also result in over-etching of the protective substrate mask 104, and thus protective substrate mask thickness variations.

Figure 1E:
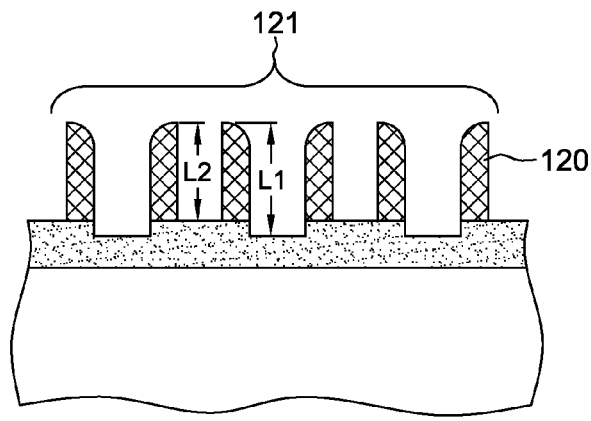

Sacrificial spacing material/layer 106 (see FIG. 1D) is subsequently etched, as depicted in FIG. 1E, by selective etch processing to create a mask pattern 121 from the remaining sidewall spacers 120. Due to the protective substrate mask thickness variations, height variations in the resultant mask pattern are seen across the wafer, as illustrated in FIG. 1E. This lack of planarity or uniformity of the mask pattern may cause undesirable variations in the resultant semiconductor structure, for instance, fin structures and/or gate structures, during subsequent fabrication processing using such a mask. As a specific example, the height "L1" of one side of a sidewall spacer of the mask pattern may be substantially different from the height "L2" on the other side of that sidewall spacer.

To at least in part address this issue, disclosed herein is a method of fabricating a mask (such as a double-patterned mask) for use, for instance, in fabricating one or more semiconductor devices. The method may include, for instance, providing sacrificial spacing structures disposed over a substrate structures, and including protective hard masks at upper surfaces thereof; disposing a sidewall spacer layer conformally over the sacrificial spacing structures; selectively removing the sidewall spacer layer from above the sacrificial spacing structures to expose the protective hard masks thereof, the selectively removing including leaving, at least in part, sidewall spacers along sidewalls of the sacrificial spacing structures; providing a protective material over the substrate structure; and removing the exposed protective hard masks from the sacrificial spacing structures, and thereafter, removing remaining portions of the sacrificial spacing structures, as well as the protective material, leaving the sidewall spacers over the substrate structure as a mask.

In one embodiment, providing of the protective material, which occurs after the selectively removing of the sidewall spacer layer from above the sacrificial spacing structures to expose the protective hard masks thereof, may include providing the protective material over the sacrificial spacing structures, as well as over the substrate structure. The providing the protective material may further include recessing the protective material to below upper surfaces of the sacrificial spacing structures to again expose the protective hard masks thereof. For instance, the protective material may be recessed to a height of about 20 to 30 percent below a height of the upper surfaces of the sacrificial spacing structures above the substrate structure.

In one example, removing the exposed protective hard mask may include removing the exposed protective hard masks from the sacrificial spacing structures along with an upper portion of the sidewall spacers along the sidewalls of the sacrificial spacing structures, wherein during the removing, the substrate structure is protected by the protective material. The protective material is, in one embodiment, chosen to be selective to at least one of an oxide etching process or a nitride etching process, which may be used during the removal of the exposed protective hard masks from the sacrificial spacing structures. In one example, the protective hard masks of the sacrificial spacing structures include a nitride material, and the protective material includes, for example, an organic material. The sacrificial spacing structures may be fabricated of or include (at least in part) at least one of an amorphous carbon material or an organic material disposed below the protective hard masks thereof. By way of example, the amorphous carbon material or the organic material may be a different material from the protective material. The selectively removing may further include selectively anisotropically removing, at least in part, the sidewall spacer layer from above the substrate structure between adjacent sacrificial spacing structures to expose the substrate structure, and from above the sacrificial spacing structures to expose the protective hard masks thereof, while leaving (at least in part) the sidewall spacers along sidewalls of the sacrificial spacing structures. As one detailed example, the sidewall spacers along the sidewalls of the sacrificial spacing structures may be a nitride.

In one implementation, the substrate structure may include a semiconductor substrate with a protective substrate mask over the semiconductor substrate. Note that, in one embodiment, the protective substrate mask over the semiconductor substrate and the protective hard mask over the sacrificial spacing structures may be a same material such as, for example, silicon nitride. In one specific example, the material of the protective substrate mask over the semiconductor substrate and the protective hard mask over the sacrificial spacing structures may also be a same material, such as, for instance, a nitride material.

By way of example, FIGS. 2A-2G depict one detailed embodiment of a method of fabricating a mask, which may be used in fabricating of one or more semiconductor devices, in accordance with one or more aspects of the present invention. The method is one example of an enhanced self-aligned, double-patterning process having a substantially uniform height of the mask elements extending above the substrate structure.

Figure 2A:
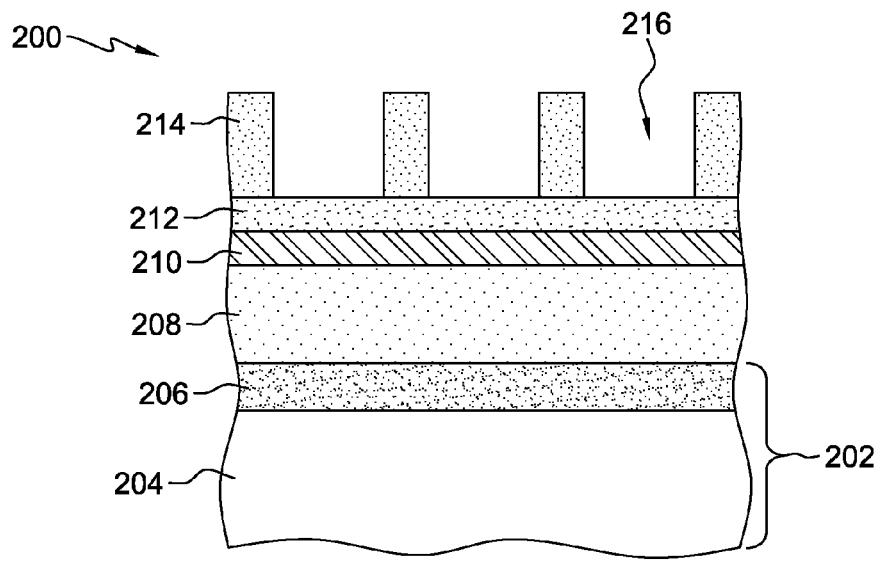
FIG. 2A is a cross-sectional elevational view of one embodiment of an intermediate structure, including a substrate structure, obtained during fabrication of one or more masks, in accordance with one or more aspects of the present invention.
Figure 2B:
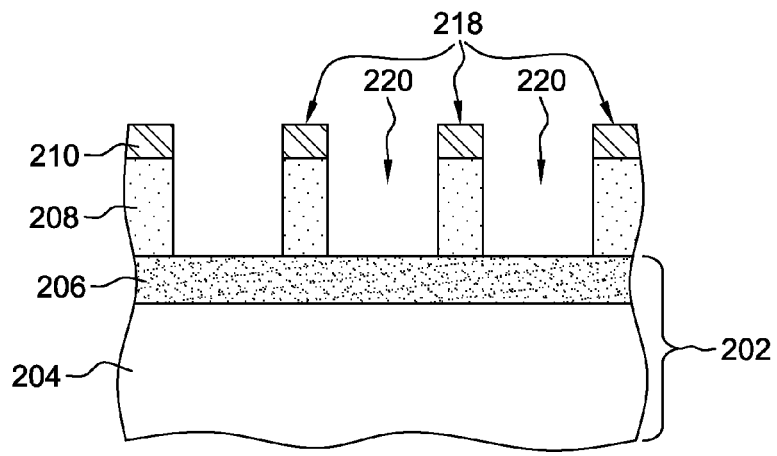
FIG. 2B depicts the structure of FIG. 2A after partial etching thereof to define sacrificial spacing structures above the substrate structure, in accordance with one or more aspects of the present invention.

FIG. 2A illustrates an intermediate structure 200, attained during fabrication of one or more masks, which includes a substrate structure 202. The substrate structure 202 includes, for instance, a semiconductor substrate 204 and a protective substrate mask 206 disposed over semiconductor substrate 204.

In one embodiment, semiconductor substrate 204 may be a bulk semiconductor material such as, for example, a bulk silicon wafer. In another embodiment, semiconductor substrate 204 may be any silicon-containing substrate including, but not limited to, a substrate fabricated of or including silicon (Si), single crystal silicon, polycrystalline Si, amorphous Si, silicon-on-nothing (SON), silicon-on-insulator (SOI), or silicon-on-replacement insulator (SRI) or the like. Substrate 102 may in addition or instead include various isolations, dopings and/or device features. For instance, the substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Protective substrate mask 206, which may be deposited over semiconductor substrate 204 using any conventional deposition processes such as CVD, PVD or ALD, may be provided to protect semiconductor substrate 204 from damage during subsequent etch processes, and depending on the fabrication process, may also prevent semiconductor substrate 204 from being oxidized by exposure to an oxygen-containing environment. In one specific example, protective substrate mask 206 may include a nitride material, such as silicon nitride ($Si_3N_4$ or SiN), or silicon oxynitride (SiON). Although protective substrate mask 206 may have a thickness suitable to act as an etch stop layer to protect semiconductor substrate 204 from damage, the thickness of the protective substrate mask 206 may vary according to the processing node in which the semiconductor device is being fabricated. In one example, the thickness of protective substrate mask 206 may be about 10 to 50 nanometers.

A sacrificial spacing layer 208 may be provided over substrate structure 202, using, for instance, any conventional deposition processes, such as atomic layer deposition (ALD), chemical-vapor deposition (CVD), physical vapor deposition (PVD) or the like. In one example, sacrificial spacing layer 208 may include a sacrificial spacing material such as, amorphous-carbon or any conventional organic material, which as understood in the art, and may be used (in one implementation) in a mask formation process as described herein to, in part, provide spacings between mask elements, as described below.

Protective hard mask 210 may be deposited over sacrificial spacing layer 208 using conventional deposition processes, such as CVD, ALD or PVD. This protective hard mask 210 may be used, in part, to preserve the patterning of smaller features than can be preserved using an organic etch mask alone. Although protective hard mask 210 may include materials such as metal, spin-on organic material, silicon dioxide ($SiO_2$), silicon carbide (SiC), tetraethyl orthosilicate (TEOS), silicon carbon nitride (SiCN), silicon oxynitride (SiON), spin-on glass (SOG), or any combinations thereof, in one embodiment, the protective hard mask material may be a nitride material, such as silicon nitride ($Si_3N_4$ or SiN). By way of further example, protective hard mask 210 may be formed of the same material as protective substrate mask 206, with the same material being, in one example, silicon nitride, formed by CVD processing.

As discussed above, one or more lithographic processing steps may be performed to etch through sacrificial spacing layer 208 to create sacrificial spacing structures. These lithographic processing steps may include, for instance, providing a lithographic stack in which, an anti-reflective coating 212 is disposed over protective hard mask 210, and a photoresist layer 214 is disposed over anti-reflective coating 212. Note that photoresist layer 214 has been patterned in FIG. 2A with openings 216, which facilitate defining a desired etched pattern. Anti-reflective coating 212 may be, for instance, a bottom anti-reflective coating (BARC) layer deposited over protective hard mask 210 to minimize any pattern distortion due to reflections. In one example, anti-reflective coating 212 includes conventional inorganic coating materials such as titanium, titanium dioxide, titanium nitride, chromium oxide, carbon or α-silicon. In another example, anti-reflective coating 212 also includes a conventional organic coating material, such as a light-absorbent material, or a polymer material or combinations thereof. As is known, patterned photoresist layer 214 protects underlying layers in the direction of etching during the subsequent etch processing, and includes the openings 216 through which the etch process proceeds. Patterned photoresist layer 214 may include, for instance, organic photoresist materials, non-organic materials, or combinations thereof.

One or more lithographic processes are performed to transfer the pattern from patterned photoresist 214 to protective hard mask 208. By way of example, these process operations may include an anti-reflective-coating open step and a hardmask open step. A final etch step is performed to obtain the structure depicted in FIG. 2B, in which the patterned photoresist layer and anti-reflective coating of the structure of FIG. 2A have been removed and the sacrificial spacing layer 208 has been etched to define a pattern of sacrificial spacing structures 218, separated by spaces 220. As shown, in one embodiment, this etch processing proceeds through sacrificial spacing layer 208, stopping, in this example, on substrate structure 202. Note that a portion of protective hard mask 210 remains above the sacrificial spacing material 208 within each sacrificial spacing structure 218.

Figure 2C:
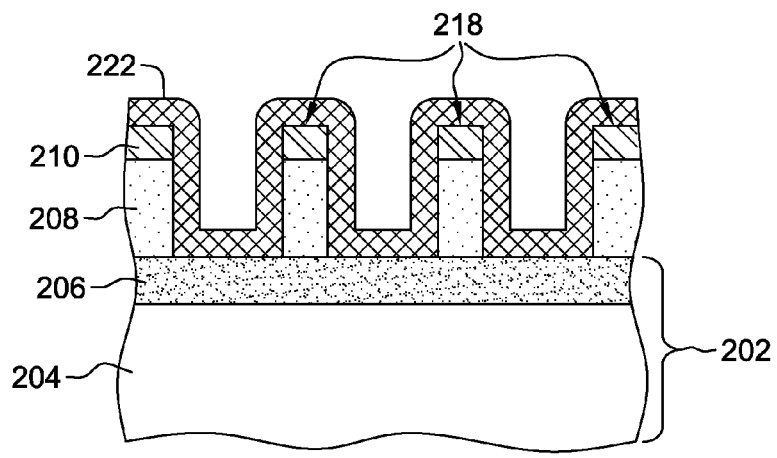
FIG. 2C depicts the structure of FIG. 2B with a sidewall spacer layer conformally provided over the sacrificial spacing structures and the substrate structure, in accordance with one or more aspects of the present invention.

As depicted in FIG. 2C, a sidewall spacer layer 222 is conformally provided over sacrificial spacing structures 218. Note that sidewall spacer layer 222 may include or be fabricated of a material that is substantially similar to the material used as the protective hard masks 210 and protective substrate mask 206. In one example, sidewall spacer layer 222 may include, for instance, a nitride material such as, for example, silicon nitride ($Si_3N_4$ or SiN), which may be conformally deposited using a variety of techniques, such as for example, chemical vapor deposition (CVD) or atomic layer deposition (ALD). In one specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogen-free precursor such as, for example, bis(t-butylamino)silane (BTBAS) ($SiC_8N_2H_{22}$) and ammonia ($NH_3$) at about 550° C. The thickness of sidewall spacer layer 222 may be about 10 to 25 nanometers, depending on the processing node in which the semiconductor device is being fabricated.

Figure 2D:
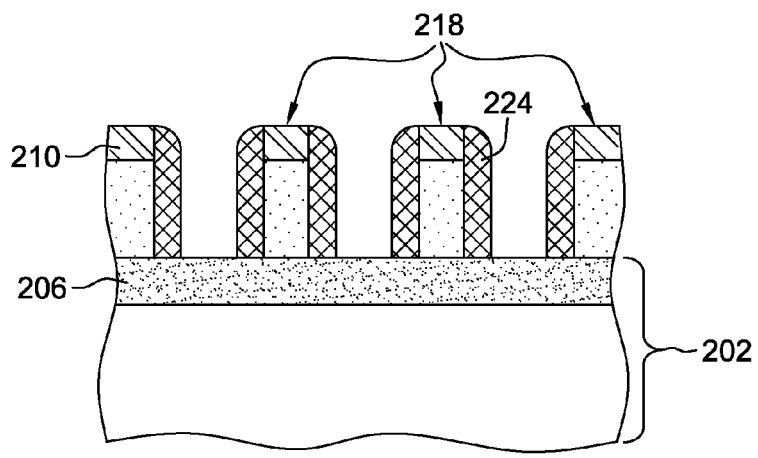
FIG. 2D depicts the structure of FIG. 2C after etching to expose the protective hard masks of the sacrificial spacing structures, and leaving sidewall spacers along the sidewalls of the sacrificial spacing structures, in accordance with one or more aspects of the present invention.

Sidewall spacer layer 222 may be etched, for instance, using any appropriate selective etching process(es), to form sidewall spacers 224 along the sidewalls of sacrificial spacing structures 218, as shown in FIG. 2D. In one embodiment, sidewall spacer layer 222 (FIG. 2C) is anisotropically removed from above substrate structure 202, between sacrificial spacing structures 218, which exposes the substrate structure (and more particularly, the protective substrate mask 206) between the sacrificial spacing structures. Note also that the sidewall spacer layer 222 (FIG. 2C) is removed from above sacrificial spacing structures 218 to expose the protective hard masks 210 disposed at the upper surfaces of sacrificial spacing structures 218, while leaving sidewall spacers 224 along the sidewalls of sacrificial spacing structures 218. Due to the substantially uniform thickness of the conformally-applied sidewall spacer layer, the selective etching of the sidewall spacer layer from above the substrate structure and above the protective hard masks is achieved without over-etching of the protective substrate mask 206 of substrate structure 202. The sidewall spacer layer may be selectively etched using conventional isotropic or anisotropic dry etching processes such as, reactive ion etching or plasma etching. In one specific example, reactive ion etching may be performed using remote plasma involving process gases such as nitrogen trifluoride ($NF_3$) and hydrogen ($H_2$). In another example, a directional anisotropic dry etching step such as, for example, reactive ion etching (RIE) may be performed using fluorine based chemistry and involving gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$) and oxygen ($O_2$).

Figure 2E:
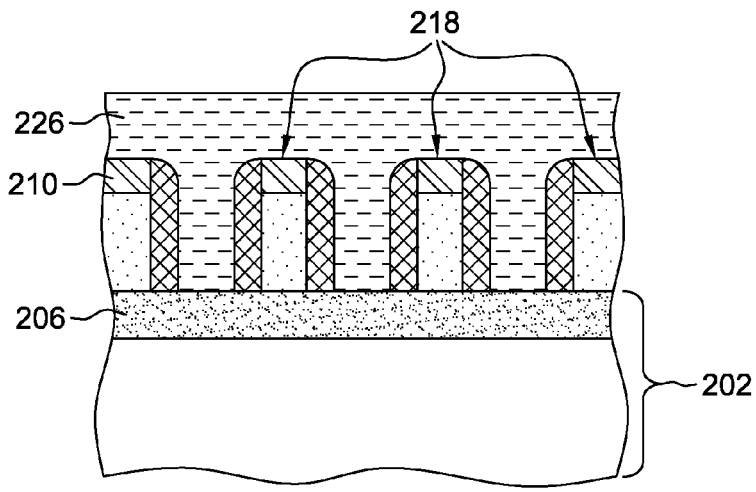
FIG. 2E depicts the structure of FIG. 2D with a protective material having been provided over the sacrificial spacing structures and the substrate structure, in accordance with one or more aspects of the present invention.

In accordance with the process embodiment depicted, a protective material 226 is next provided over sacrificial spacing structures 218 and substrate structure 202, as illustrated in FIG. 2E. This protective material 226 may be deposited using a variety of techniques, such as, for example, chemical vapor deposition (CVD), atomic layer deposition (ALD) or physical vapor deposition (PVD) processes, and the thickness of the layer above the sacrificial spacing structures 218 may be (in one example) sufficient to allow for subsequent planarization of the structure. By way of example, protective material 226 may be or include an organic material. For instance, flowable oxide such as, for example, a hydrogen silsesquioxane polymer, or a carbon-free silsesquioxane polymer, may be deposited as the protective material 226 by flowable chemical vapor deposition (F-CVD). In another example, protective material 226 may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB). In another example, protective material 226 may be or include any conventional organic planarizing layer (OPL) material or any conventional bottom anti-reflective coating (BARC) material. Note that this protective layer is selected and provided to advantageously protect protective substrate mask 206 from attack during subsequent etch processing.

Figure 2F:
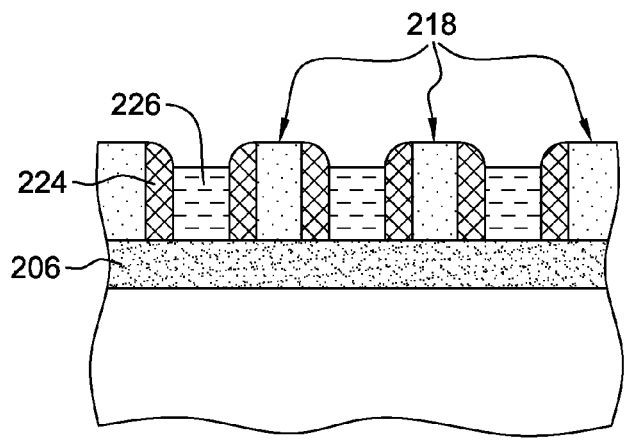
FIG. 2F depicts the structure of FIG. 2E after partial recessing of the protective material to, at least in part, expose the protective hard masks of the sacrificial spacing structures, in accordance with one or more aspects of the present invention.

As illustrated in FIG. 2F, a non-selective chemical-mechanical polish or an etch-back polish may be employed to polish away excess protective material 226, using (in one embodiment) the protective hard masks (not shown) above the upper surfaces of sacrificial spacing structures 218, as an etch stop, thereby exposing the protective hard masks. In one example, during the process step, the protective material may be recessed to a height of about 20 to 30 percent below a height of the upper surfaces of the sacrificial spacing structures 218 (shown in FIG. 2E) above substrate structure 202.

To achieve the structure of FIG. 2F, an additional etching processing (such as, for instance, an over-etching process or a break-through process) may next be performed to selectively remove the exposed protective hard masks 210 (FIG. 2E) from above the sacrificial spacing structures 218, resulting (in one embodiment) in the structure shown in FIG. 2F. Note that, during this etch process, protective material 226 disposed between sacrificial spacing structures 218 advantageously protects the protective substrate mask 206 from attack. Note also that this additional etch processing to remove protective hard masks 218 (FIG. 2E) results in further recessing of the sidewall spacers 224 along the sidewalls of sacrificial spacing structures 218, for instance, to a height as shown in FIG. 2F. In one example, the height of the resultant sidewall spacers may be in a range of about 50 to 80 nanometers.

Figure 2G:
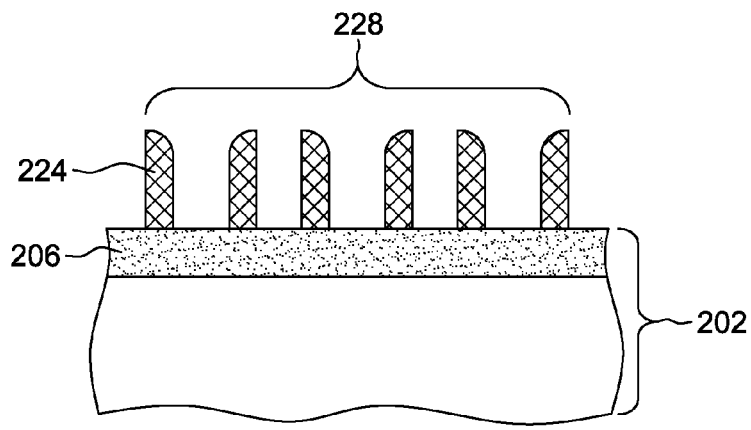
FIG. 2G depicts a mask structure obtained after nonselective removal of the remaining protective material and the remaining portions of the sacrificial spacing structures, in accordance with one or more aspects of the present invention.

As illustrated in FIG. 2G, one or more etch processes may be performed to selectively remove the remaining protective material 226 (see FIG. 2F) and the remaining portions of sacrificial spacing material 218 (see FIG. 2F) from the structure, leaving sidewall spacers 224 as the mask elements in the desired pattern 228, for example, for use in fabricating one or more semiconductor structures or devices. The selective etch process may be one or more anisotropic, dry-etch processes such as, for example, oxygen strip or plasma etching processing. Note that, advantageously, there is no variation in height, as shown in FIG. 2G, in the protective substrate mask underlying the mask pattern, using the processing of FIGS. 2A-2G. In a further implementation, protective substrate mask 206 may be patterned using the sidewall spacers 224 to create a mask pattern. The patterned mask may then be used in patterning the underlying semiconductor substrate, for instance, to provide one or more fin structures in or extending from the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing sacrificial spacing structures disposed over a substrate structure, the sacrificial spacing structures comprising a sacrificial material and a protective hard mask material, the protective hard mask material being disposed over the sacrificial material of the sacrificial spacing structures;
   disposing a sidewall spacer layer conformally over the sacrificial spacing structures;
   selectively removing the sidewall spacer layer from above the sacrificial spacing structures to expose the protective hard mask material thereof, the selectively removing comprising leaving, at least in part, sidewall spacers along sidewalls of the sacrificial spacing structures;
   providing a protective material layer over the substrate structure; and
   removing the exposed protective hard mask material from the sacrificial spacing structures, the protective material layer protecting the substrate structure during the removing of the exposed protective hard mask material from the sacrificial spacing structures, and thereafter, removing the sacrificial material of sacrificial spacing structures, as well as the protective material layer, leaving the sidewall spacers over the substrate structure as a mask.

2. The method of claim 1, wherein providing of the protective material layer is subsequent to selectively removing of the sidewall spacer layer from above the sacrificial spacing structures to expose the protective hard mask material thereof.

3. The method of claim 1, wherein providing the protective material layer further comprises providing the protective material layer over the sacrificial spacing structures, as well as over the substrate structure.

4. The method of claim 3, wherein providing the protective material layer further comprises recessing the protective material layer to below upper surfaces of the sacrificial spacing structures to again expose the protective hard mask material thereof.

5. The method of claim 4, wherein recessing the protective material layer comprises recessing the protective material layer to a height of about 20 percent to 30 percent below a height of the upper surfaces of the sacrificial spacing structures above the substrate structure.

6. The method of claim 1, wherein removing the exposed protective hard mask material comprises removing the exposed protective hard mask material from the sacrificial spacing structures along with an upper portion of the sidewall spacers along the sidewalls of the sacrificial spacing structures, wherein during the removing, the substrate structure is protected by the protective material layer.

7. The method of claim 1, wherein the protective material layer is selective to at least one of an oxide etching or a nitride etching used during the removing of the exposed protective hard mask material from the sacrificial spacing structures.

8. The method of claim 7, wherein the protective hard mask material of the sacrificial spacing structures comprises a nitride material and the protective material layer is selective to the nitride etching.

9. The method of claim 1, wherein the protective material layer comprises an organic material.

10. The method of claim 1, wherein the sacrificial material of the sacrificial spacing structures comprises one of an amorphous carbon material or an organic material disposed below the protective hard mask material thereof, the one of the amorphous carbon material or the organic material being a different material from the protective material layer.

11. The method of claim 1, wherein the selectively removing further comprises selectively anisotropically removing, at least in part, the sidewall spacer layer from above the substrate structure between adjacent sacrificial spacing structures, exposing the substrate structure, and from above the sacrificial spacing structures, exposing the protective hard mask material thereof, while leaving, at least in part, the sidewall spacers along sidewalls of the sacrificial spacing structures.

12. The method of claim 11, wherein the leaving comprises leaving sidewall spacers along the sidewalls of the sacrificial spacing structures comprising a thickness of about 10 nanometers to about 25 nanometers, and wherein the sidewall spacers comprise a nitride.

13. The method of claim 1, wherein providing the protective material layer is subsequent to the selectively removing of the sidewall spacer layer from above the sacrificial spacing structures to expose the protective hard mask material thereof, the protective material layer being provided over the sacrificial spacing structures, as well as over the substrate structure, and wherein the providing the protective material layer further comprises recessing the protective material layer to below upper surfaces of the sacrificial spacing structures to again expose the protective hard masks thereof.

14. The method of claim 13, wherein removing the exposed protective hard mask material comprises removing the exposed protective hard mask material from the sacrificial spacing structures along with an upper portion of the sidewall spacers along the sidewalls of the sacrificial spacing structures, wherein during the removing, the substrate structure is protected by the protective material layer.

15. The method of claim 14, wherein the protective material layer is selective to at least one of an oxide etching or a nitride etching used during the removing of the exposed protective hard mask material from the sacrificial spacing structures, and wherein the protective material layer comprises an organic material.

16. The method of claim 15, wherein the sacrificial material of the sacrificial spacing structures comprises one of an amorphous carbon material or an organic material disposed below the protective hard mask material thereof, the one of the amorphous carbon material or the organic material being a different material from the protective material layer.

17. The method of claim 1, wherein substrate structure comprises a semiconductor substrate with a protective substrate mask over the semiconductor substrate.

18. The method of claim 17, wherein the protective substrate mask has a thickness of about 10 nanometers to about 50 nanometers.

19. The method of claim 18, wherein the protective substrate mask over the semiconductor substrate and the protective hard mask material over the sacrificial material of the sacrificial spacing structures comprise a same material.

20. The method of claim 19, wherein the same material comprises a nitride material.

\* \* \* \* \*